United States Patent [19]

Rasch et al.

[11] Patent Number: 4,642,414

[45] Date of Patent: Feb. 10, 1987

[54] SOLAR CELL

[75] Inventors: Klaus-Dieter Rasch, Talheim; Gerhard Strobl, Stuttgart, both of Fed. Rep. of Germany

[73] Assignee: Telefunken Electronic GmbH, Heilbronn, Fed. Rep. of Germany

[21] Appl. No.: 734,843

[22] Filed: May 16, 1985

[30] Foreign Application Priority Data

Jun. 5, 1984 [DE] Fed. Rep. of Germany ....... 3420887

[51] Int. Cl.$^4$ ............................................. H01L 31/06
[52] U.S. Cl. ..................................... 136/256; 136/255; 136/258; 136/261; 136/262; 357/30; 357/52
[58] Field of Search ................. 136/255, 256, 258 PC, 136/261, 262; 357/30, 52

[56] References Cited

U.S. PATENT DOCUMENTS 4,322,253 3/1982 Pankove et al. ..................... 148/1.5
4,404,422 9/1983 Green et al. ......................... 136/255

FOREIGN PATENT DOCUMENTS 2119167 11/1983 United Kingdom ........ 136/258 AM

OTHER PUBLICATIONS

Y. Uchida et al, *Japanese J. Appl. Phys.*, vol. 21, pp. L586–L588, (1982).
P. H. Fang et al, *Appl. Phys. Lett.*, vol. 41, pp. 365–366, (1982).
*Semiconductors & Semimetals*, vol. 11–"Solar Cells" by H. J. Hovel. Academic Press, New York (1975), pp. 28–30, 39–46, 78–82.

*Primary Examiner*—Aaron Weisstuch
*Attorney, Agent, or Firm*—Spencer & Frank

[57] ABSTRACT

The invention relates to a solar cell, wherein, in order to increase the efficiency, an amorphous or microcrystalline silicon layer is disposed on the side facing the incident light, thereby enabling the surface recombination speed to be reduced. In a preferred embodiment, this silicon layer is doped and is therefore additionally available for charge carrier transport. High doping effects are thus avoided in the thin surface zone of the semiconductor body.

16 Claims, 4 Drawing Figures

SOLAR CELL

BACKGROUND OF THE INVENTION

The invention relates to a solar cell comprising of a semiconductor body containing a pn-junction, with the thin surface zone of the semiconductor body being of one conduction type and having a metallization, a rear side contact, and a layer for reducing reflection.

Today, mainly monocrystalline or polycrystalline silicon solar cells with an efficiency of approximately 14% are used for the conversion of solar energy into electrical energy. Efficiency losses result, inter alia, from reflection losses, incomplete absorption, partial utilization of the photon energy, recombination of generated charge carriers, and deviation of the energy band gap of the starting material from the ideal optimum of 1.4 eV, etc.

For better utilization of the AM1 spectrum (air mass 1)-solar spectrum after absorption in the atmosphere in relation to sea level when the sun is in its highest position—an efficiency of approximately 22% is obtained with solar cells based on gallium arsenide on account of its almost ideal energy band gap of 1.43 eV. The manufacture of gallium arsenide solar cells is still relatively expensive for mass production.

Tests with amorphous silicon have already been carried out with a view to enabling economical production of solar cells. The reason for this lies in the cost-reduced manufacture of the starting material, in the low material consumption, and also in the possibility of mass production.

With solar cells made from amorphous silicon, however, an efficiency of only 5.5% was obtained for cells made in a continuous production process. Also the efficiency of monocrystalline or polycrystalline silicon solar cells is still unsatisfactory.

SUMMARY OF THE INVENTION

The object underlying the present invention is therefore to produce an economical solar cell with an increased efficiency in comparison to conventional solar cells.

This object is attained in accordance with the invention with a solar cell of the kind mentioned at the outset wherein the semiconductor body is composed of monocrystalline or polycrystalline semiconductor material, by arranging an amorphous or microcrystalline silicon layer underneath the layer for reducing the reflection.

These measures result in a relatively low cost increase in the efficiency of a solar cell by recombination centers being reduced.

In advantageous further developments, this may be effected by the amorphous or microcrystalline silicon layer being arranged either directly underneath the layer reducing the reflection or directly above the thin surface zone of the one conduction type. The semiconductor body of the solar cell preferably consists of doped silicon or gallium arsenide, with the semiconductor body being monocrystalline or polycrystalline.

By treatment with hydrogen to saturate free valences and by addition of carbon to produce an optical window layer with a band gap energy of approximately 3 eV, the surface recombination speed on the side of the thin surface zone facing the light incidence can be very substantially reduced.

By doping with, for example, phosphorous, the amorphous or microcrystalline silicon layer is also available for charge carrier transport. It is thus possible to make the thin surface zone of a solar cell even thinner, thereby enabling better utilization of the short-wave portion of the spectrum and, at the same time, reduced doping of the thin surface zone is possible in order to avoid high doping effects at the surface of this zone and the recombination centers linked thereto.

Further advantageous embodiments of the invention and their manufacturing processes are apparent from the following.

BRIEF DESCRIPTION OF THE DRAWINGS

Embodiments of the invention are illustrated in the Figures and shall be described in greater detail hereinafter.

DESCRIPTION OF THE PREFERRED EMBODIMENTS

Figure 1:
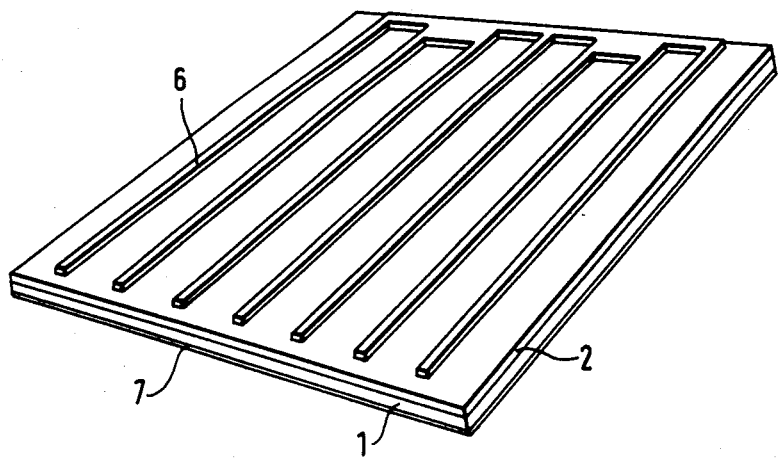
FIG. 1 shows a perspective illustration of a solar cell.

FIG. 1 shows the basic design of a solar cell consisting of a semiconductor body (1), (2) with a thin surface zone (2) of the one conduction type, a comb-type metallization (6) which is disposed directly onto the thin surface zone (2) and faces the incident light, and a rear side contact (7) which extends throughout the entire surface and is arranged on the substrate (1) of the other conduction type of the semiconductor body (1), (2). If desired, the metallization 6 may be of the double comb-type.

Figure 2:
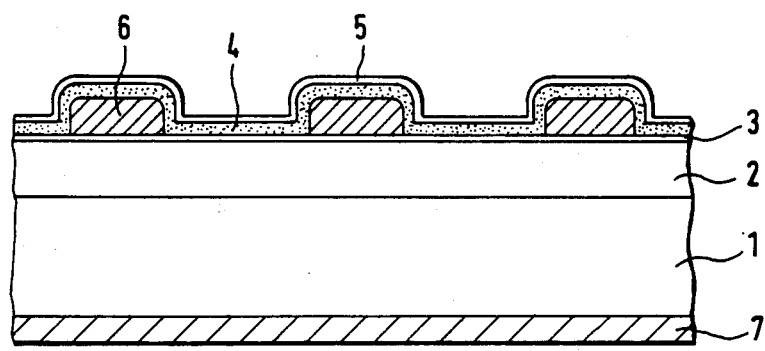
FIG. 2 shows a layer structure of a solar cell with an amorphous or microcrystalline silicon layer (4)

The semiconductor body (1), (2) of the solar cell in FIG. 2 consists, for example, of monocrystalline or polycrystalline silicon, with the substrate (1) being p-doped with approximately $10^{15}$ atoms/cm$^3$ and the thin surface zone (2) being strongly n+-doped with approximately $10^{20}$ atoms/cm$^3$. The semiconductor body (1), (2) has a thickness of approximately 200 μm, with the thin surface zone (2) being approximately 0.5 μm thick. Boron is preferably used as doping material in the substrate (1), and phosphorous in the thin surface zone (2). It is, however, also conceivable to use other doping materials from the third and fifth groups of the periodic system of elements.

Disposed directly on the thin surface zone (2) is an extremely thin layer (3) of silicon dioxide with a layer thickness of approximately 2 nm, which forms together with the following contact fingers of the metallization (6) an MIS structure, thereby favoring minority charge carriers and impeding majority charge carriers.

Disposed on the contact fingers of the metallization (6) and on the extremely thin layer (3) of silicon dioxide is an amorphous or microcrystalline silicon layer (4) with a layer thickness of approximately 0.05–0.005 μm. By hydrogenation with hydrogen, free valences in it are saturated, and by the addition of preferably carbon, the energy band gap may be increased up to 3 eV, whereby this layer cannot absorb any incident light and acts as an optical window.

The amorphous or microcrystalline and, in this case, undoped silicon layer (4) decreases the surface recombination speed on the side of the thin surface zone (2) consisting of crystalline silicon which faces the incident light, whereby more charge carrier pairs are produced in the proximity of the pn-junction. As a result thereof, voltage and current of the thus structured solar cell increase indirectly, which results in an increase in the efficiency.

Arranged above the amorphous or microcrystalline silicon layer (4) is a layer (5) for reducing the reflection and consisting, for example, of titanium oxide, silicon monoxide, silicon dioxide, tantalum oxide, niobium oxide, aluminum oxide, or a single or multiple layer combination of these materials.

Arranged on the side of the solar cell facing away from the incident light is a rear side contact (7) consisting of the same material as the metallization (6) which is composed, for example, of aluminum, silver, nickel, copper, or a layer sequence of titanium-palladium-silver. The separate connecting elements for the formation of a solar cell battery may consist of the same materials. In accordance with FIG. 1, the metallization (6) may be of comb-type configuration, with one single web having a cross-sectional height of approximately 10 μm and a width of from 6 to 10 μm.

Figure 3:
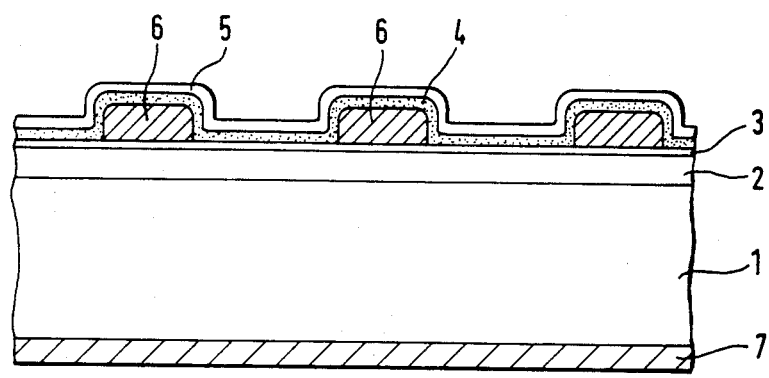
FIG. 3 shows a layer structure of a solar cell with a doped amorphous or microcrystalline silicon layer (4)

FIG. 3 illustrates a layer sequence for a solar cell which is, in principle, of the same design as the solar cell according to FIG. 2. There are, however, two differences from FIG. 2:

1. The amorphous or microcrystalline silicon layer (4) is doped with approximately $10^{20}$ atoms/cm$^3$, with either a p- or an n-doping being possible with elements of the third and fifth group of the periodic system of elements.
2. The thin surface zone (2) of the solar cell with approximately 0.25 μm is substantially thinner than that in FIG. 2, and with approximately $10^{19}$ atoms/cm$^3$ is, furthermore, doped to a lesser degree.

These measures enable better utilization of the short-wave portion of the solar spectrum since the short-wave radiation for generation of charge carrier pairs is thus not prematurely absorbed in the proximity of the surface of the thin surface zone (2).

These measures also enable avoidance of high doping effects at the surface of the thin surface zone (2).

Since the amorphous or microcrystalline silicon layer (4) is, in this case, doped, it is therefore available for charge carrier transport, whereby the increase in the layer resistance of the thin surface zone (2) caused by the aforementioned measures is substantially compensated.

Figure 4:
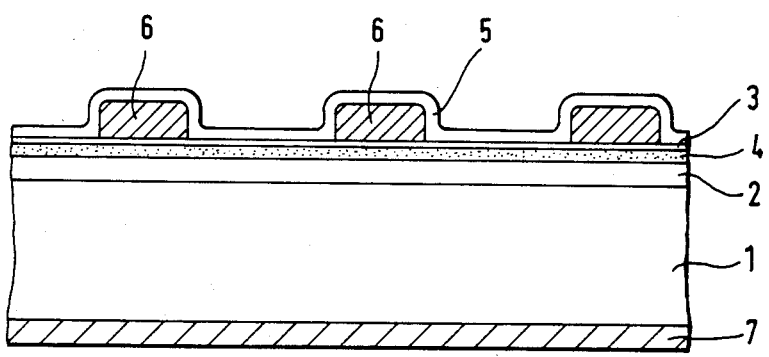
FIG. 4 shows a layer structure of a solar cell with a doped amorphous or microcrystalline silicon layer (4) wherein this layer is arranged directly above the thin surface zone (2).

FIG. 4 illustrates a layer structure for a solar cell which constitutes a modification of the solar cells according to FIGS. 2 and 3.

The semiconductor body (1), (2) again consists of monocrystalline or polycrystalline silicon, with the substrate (1) being p-doped with approximately $10^{15}$ atoms/cm$^3$ and the thin surface zone (2) being strongly n+-doped with approximately $10^{20}$ atoms/cm$^3$. The semiconductor body (1), (2) has a thickness of approximately 200 μm, with the thin surface zone (2) being approximately 0.25 μm thick. Boron is preferably used as doping material in the substrate (1) and phosphorous in the thin surface zone (2). Disposed directly on the thin surface zone (2) is the doped amorphous or microcrystalline silicon layer (4) of approximately 0.05-0.005 μm thickness. It contains additions of hydrogen and carbon and is p- or n-doped with approximately $10^{20}$ atoms/cm$^3$. The amorphous or microcrystalline silicon layer (4) is directly followed by an extremely thin layer (3) of silicon dioxide of a thickness of approximately 2 nm, whereby an MIS structure which favors minority charge carriers and impedes majority charge carriers is produced together with the following metallization (6).

The metallization (6) which, in this case, is likewise of comb-type configuration is coated with a layer (5) which reduces reflection and is of the same material composition as that of the solar cells according to FIG. 2 or 3.

For better utilization of an AM1 spectrum, gallium arsenide is also very suitable for the semiconductor body (1), (2) on account of its almost ideal energy band gap of 1.43 eV.

An amorphous or microcrystalline silicon layer (4) with a layer structure according to FIGS. 2, 3 and 4 is likewise suitable for increasing the efficiency of such a solar cell made of GaAs. In this case, the substrate (1) of a gallium arsenide solar cell is p-doped by, for example, zinc with approximately $10^{15}$ atoms/cm$^3$ and the thin surface zone (2) is n-doped with, for example, sulphur at $4-5 \cdot 10^{18}$ atoms/cm$^3$.

The semiconductor body (1) (2) of the gallium arsenide solar cell may also be disposed on a substrate of GaAs or Ge.

The doped, amorphous or microcrystalline silicon layer (4) is produced by a glow discharge process with silane (SiH$_4$), methane (CH$_4$) or ethylene (C$_2$H$_4$) and phosphine (PH$_3$). A CVD (chemical vapor deposition) process is also feasible. The amorphous or microcrystalline silicon layer (4) may also be applied by sputtering or evaporation.

The layer (5) for reducing front surface reflection may be produced thermally, by immersion, or by a CVD process. The layer (5) may also be applied by evaporating, centrifuging, or spraying.

In order to interconnect the single solar cells to form a solar battery, the contacts and the contacting areas of the metallization (6) are connected to one another by a welding or soldering process.

Depending on the type of application and cost-efficiency, monocrystalline or polycrystalline starting material will be used for the semiconductor body (1), (2), preferably monocrystalline for use in space, and polycrystalline in terrestrial applications.

What is claimed is:

1. Solar cell, comprising: a semiconductor body consisting of a monocrystalline or polycrystalline semiconductor material and containing a pn-junction formed between a thin front surface zone of said semiconductor body which is of one conduction type and the remainder of said semiconductor body which is of the other conduction type; a front surface metallization; a rear surface contact; a layer for reducing front surface reflection overlying said front surface metallization; and an amorphous or microcrystalline silicon layer arranged underneath said layer for reducing front surface reflection.

2. Solar cell according to claim 1, wherein an extremely thin layer of silicon dioxide is arranged directly underneath the front surface metallization and above the front surface zone.

3. Solar cell according to claim 2, wherein the amorphous or microcrystalline silicon layer covers the surface of the front surface metallization and the surface of the extremely thin layer of silicon dioxide.

4. Solar cell according to claim 2, wherein said amorphous or microcrystalline silicon layer is arranged between the extremely thin layer of silicon dioxide and the front surface zone.

5. Solar cell according to claim 1, wherein said amorphous or microcrystalline silicon layer is doped.

6. Solar cell according to claim 5, wherein materials of the third and fifth groups of the periodic system of elements are used for p- and n-doping respectively of the amorphous or microcrystalline silicon layer.

7. Solar cell according to claim 5, wherein the thin a front surface zone has a layer thickness of approximately 0.25 µm.

8. Solar cell according to claim 1, wherein said semiconductor body consists of doped silicon or gallium aresenide.

9. Solar cell according to claim 8, wherein said semiconductor body consists of gallium arsenide and is disposed on a substrate of GaAs or Ge.

10. Solar cell according to claim 1, wherein said layer for reducing reflection consists of titanium oxide, silicon monoxide, silicon dioxide, tantalum oxide, niobium oxide, aluminum oxide, or a single or multiple layer combination of these materials.

11. Solar cell according to claim 1, wherein said front surface metallization underneath said layer for reducing front surface reflection has a comb structure or a double comb structure and both it and said rear side contact consist of aluminum, silver, nickel, or copper.

12. Solar cell according to claim 1, wherein the valences of said amorphous or microcrystalline silicon layer are saturated by treatment with hydrogen, an optical window of approximately 3 eV band gap energy is provided by the introduction of carbon, and the conductivity of this layer is determined by the addition of phosphorous.

13. Solar cell according to claim 1, wherein said amorphous or microcrystalline silicon layer is produced by a glow discharge of CVD (chemical vapor deposition) process or is applied by sputtering or evaporation.

14. Solar cell according to claim 1, wherein said layer for reducing front surface reflection is produced thermally, by immersion, by a CVD process, or is applied by evaporation, centrifuging, or spraying.

15. Solar cell according to claim 1, wherein said amorphous or microcrystalline silicon layer is undoped.

16. Solar cell according to claim 15, wherein said thin surface zone has a layer thickness of approximately 0.5 µm.

* * * * *